United States Patent [19]

Kinugawa et al.

[11] Patent Number: 4,901,193

[45] Date of Patent: Feb. 13, 1990

[54] CONSTRUCTION OF FITTING FLEXIBLE BOARD WITHIN ELECTRONIC APPARATUS

[75] Inventors: Seiichi Kinugawa; Seio Kainoh; Takashi Kawashima, all of Nara; Katsumi Okabe, Kyoto, all of Japan

[73] Assignee: Sharp Kabushiki Kaisha, Osaka, Japan

[21] Appl. No.: 82,514

[22] Filed: Aug. 7, 1987

[30] Foreign Application Priority Data

Aug. 7, 1986 [JP] Japan .................. 61-122770[U]

[51] Int. Cl.[4] .................. H05F 3/00; H05K 9/00
[52] U.S. Cl. .................. 361/212; 361/398; 364/708
[58] Field of Search .............. 361/398, 212, 220, 388; 365/2; 364/708

[56] References Cited

U.S. PATENT DOCUMENTS

| 414,728 | 8/1978 | Kasubuchi | 364/708 X |
|---|---|---|---|
| 2,854,502 | 9/1958 | Richter | 174/68.5 |
| 3,836,824 | 9/1974 | Watrous | 361/398 |
| 4,130,723 | 12/1978 | Wakeling | 174/68.5 |
| 4,147,889 | 4/1979 | Andrews et al. | 361/388 X |
| 4,303,960 | 12/1981 | Sherwood et al. | 361/212 |
| 4,314,117 | 2/1982 | Ditzig | 361/398 X |
| 4,360,858 | 11/1982 | Fahling | 361/398 X |
| 4,495,546 | 1/1985 | Nakamura et al. | 361/388 X |
| 4,581,495 | 4/1986 | Geri et al. | 361/398 X |
| 4,586,106 | 4/1986 | Frazier | 361/212 |
| 4,616,291 | 10/1986 | Sarnezki et al. | 364/708 X |
| 4,667,266 | 5/1987 | Masuoka et al. | 361/212 |
| 4,716,259 | 12/1987 | Tokura et al. | 361/398 X |

FOREIGN PATENT DOCUMENTS

| 346953 | 7/1974 | Austria . |  |
| 1690062 | 9/1967 | Fed. Rep. of Germany . |  |
| 1136753 | 10/1965 | United Kingdom . |  |
| 1457809 | 2/1974 | United Kingdom . |  |
| 1545531 | 5/1979 | United Kingdom | 361/398 |

Primary Examiner—Gerald P. Tolin
Attorney, Agent, or Firm—Birch, Stewart, Kolasch & Birch

[57] ABSTRACT

An electronic apparatus including a flexible circuit board, with an electric wiring pattern, having an opening therein, an a supporter for supporting the flexible circuit board, the supporter being provided with an least one protruding member, wherein the protruding member is inserted into the opening of the flexible circuit board, so that the flexible circuit board with the wiring pattern is folded over both sides of said supporter means.

13 Claims, 4 Drawing Sheets

CONSTRUCTION OF FITTING FLEXIBLE BOARD WITHIN ELECTRONIC APPARATUS

BACKGROUND OF THE INVENTION

The present invention relates to a construction for fitting a flexible board straddling both sides of a supporter within an electronic apparatus.

Conventionally, a flexible board is positioned within an electronic apparatus, and no useful construction for easily positioning the flexible board has been proposed to transmit electrostatic energy with a simplified construction.

SUMMARY OF THE INVENTION

Accordingly, it is an object of the present invention to provide an improved construction of fitting a flexible board within an electronic apparatus.

It is another object to provide an improved construction for straddling both sides of a supporter so that external electrostatic charge may be transmitted to the supporter and so that the destruction of a circuit component by external electrostatic charge may be easily prevented with low cost.

Briefly described, in accordance with the present invention, an electronic apparatus includes a flexible circuit board means, with an electric wiring pattern, having an opening therein, and a supporter means for supporting the flexible circuit board means, the supporter means being provided with protruding means, wherein the protruding means is inserted into the opening of said flexible circuit board means, so that said flexible circuit board with the wiring pattern is folded over both sides of said supporter means.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENT

Figure 1:
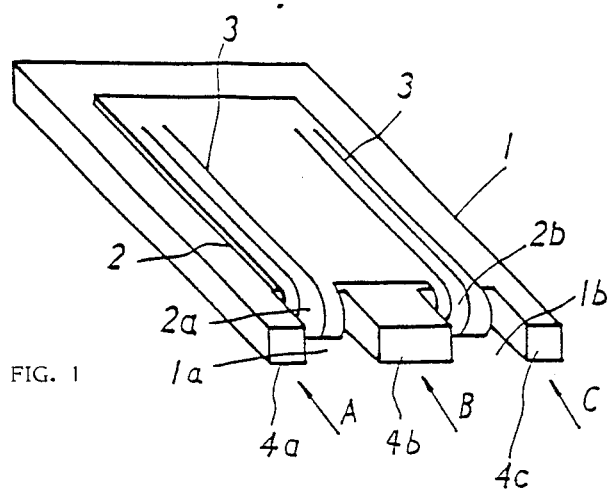
FIG. 1 is a perspective view of a structure of fitting a flexible board within an electronic apparatus according to a preferred embodiment of the present invention.

FIG. 1 is a perspective view of a structure for fitting a flexible board within an electronic apparatus according to the preferred embodiment of the present invention.

A flexible board (made of a synthetic resin or so) 2 is positioned by straddling both sides of a supporter 1 made of iron.

Concave portions 1a and 1b are provided at the side portions at which said flexible board 2 is folded. On the concave portions 1a and 1b, folded portions 2a and 2b of said flexible board 2 having a wiring pattern 3 are inserted.

The respective folded portions 2a and 2b of the flexible board 2 having the wiring pattern 3 are located at the bottom of said concave portions 1a and 1b. Accordingly, the wiring pattern provided at the bottom of the concave portion 1a is surrounded by protruding portions 4a and 4b protruding from both sides of the concave portion 1a, and the writing pattern provided at the bottom of the concave portion 1b is surrounded by 4b and 4c protruding from both sides of the concave portion 1b.

In an electronic apparatus including the supporter 1 and the flexible board 2, external electrostatic charge can be transmitted to the protruding portions which define said concave portions 1a and 1b of said supporter 1. Accordingly, external electrostatic charge can be transmitted into neither of the folded portions 2a or 2b of the flexible board 2 having the wiring pattern 3.

A hole is provided at the portion of the flexible board 2 without any wiring pattern 3 which passes through the protruding portion 4b through, so that the wiring patterns of the folded portion are located at the bottom of the concave portions 1a and 1b.

Figure 2:
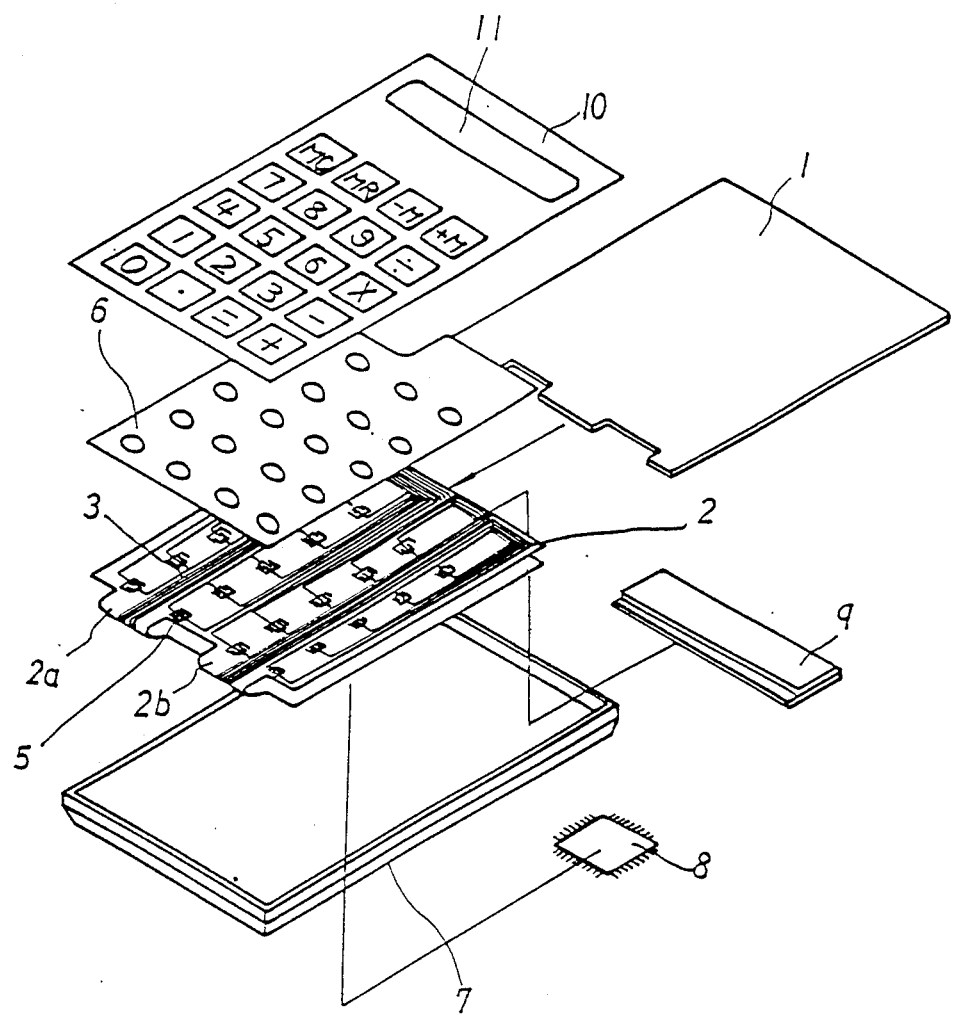
FIG. 2 is an exploded view of an electronic apparatus embodying said fitting structure of the present invention.

FIG. 2 shows an exemplary condition of mounting a flexible board which provides a preferred embodiment according to the present invention.

A flexible board 2 is folded in which the supporter 1 is inserted.

On the flexible board 2, there are formed wiring pattern 3 which goes through the folded portion of the flexible board 2 and another wiring pattern shaped as the teeth of a comb (fixed contact 5 which serves as a key contact and does not go through the folded portion).

One side of the flexible board 2 has a spacer 6 which is stored within a cabinet 7. The other side of the flexible board 2 has an LSI 8 and display part 9 comprising a liquid crystal display cell. Each part 8 and 9 is electrically connected to the wiring pattern 3 on the flexible board 2.

The spacer 6 is to provide a distance between a conductive contact or movable contact (not shown) which is formed on a film 10 and a fixed contact 5 on the flexible board 2. On the front surface of the film 10, key symbols such as numbers are printed, and, on the rear surface of the film 10, the movable contacts corresponding to said key symbols are printed. When an operator pushes the key symbols, movable contacts corresponding to the pushed key symbols are electrically connected to the corresponding fixed contacts 5 via said spacer 6. According to the data inputted by the keys, the LSI 8 activates, for example, operation, and the result is outputted at the display part 9. Output of the display part 9 can be seen from outside through the transparent portion 11 of the film 10.

Said film 10 surrounded with tape (not shown) is connected to the cabinet 7 by the adhesiveness of the tape. However, from the space between the film 10 and cabinet 7, external electrostatic charge may enter the inside of the apparatus.

Therefore, in the present embodiment, by positioning the supporter 1 nearer than the flexible board 2 (more exactly, than the wiring pattern 3 mounted on the folded portion of the flexible board 2) to the possible inlet of the electrostatic energy, electrostatic charge from the outside can be transmitted to the supporter 1, whereby the LSI 8 can be protected.

In FIG. 2, some parts such as power source are omitted.

Additionally, the supporter 1 is utilized not only for preventing the adverse effect of the electrostatic charge but for strengthening the body of the apparatus.

Figure 3:
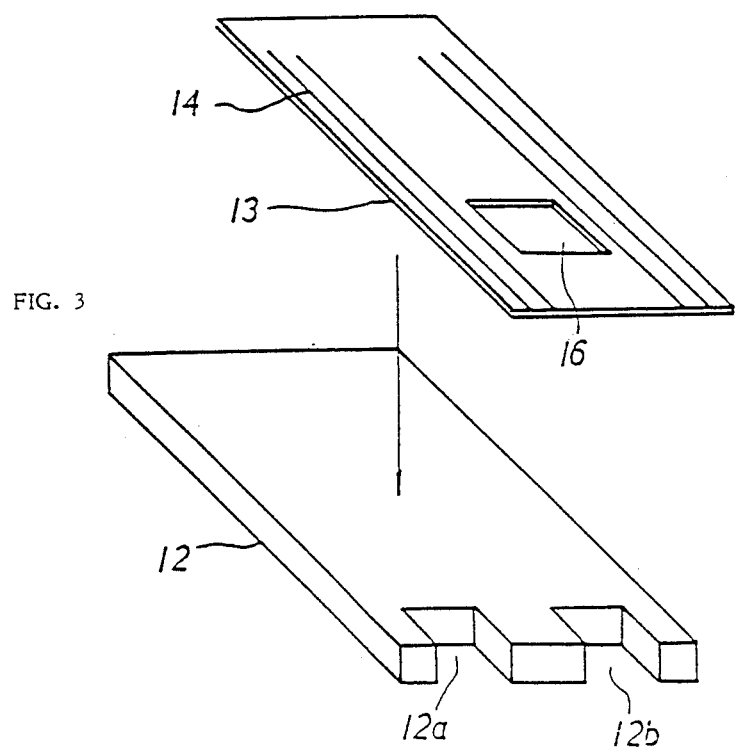
FIGS. 3 and 4 are for explaining a structure of fitting a flexible board within an electronic apparatus according to another preferred embodiment of the present invention.
Figure 4:
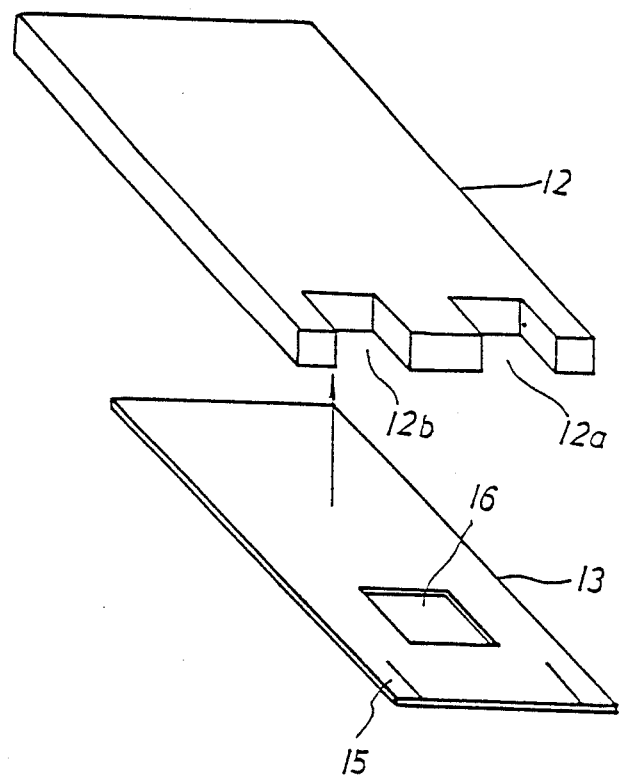

FIGS. 3 and 4 show another preferred embodiment according to the present invention in which a two-sided flexible board with a wiring pattern on both sides is used.

FIG. 3 is a first exploded view in which a supporter 12 made of iron is positioned in the direction of a flexible board 13. FIG. 4 is a second exploded view in which the flexible board 13 is positioned in the direction of the supporter 12.

The side of said flexible board 13 not facing the supporter 12 has a wiring pattern 14 connected to signal terminals of a circuit component. The other side of the flexible board 13 facing the supporter 12 has a grounded line (GND) 15.

In FIGS. 3 and 4, the flexible board 13 is shown as flat, but when assembled, the folded portion of the flexible board 13 having the wiring pattern 14 is located at the bottom of concave portions 12a and 12. The portions 12a and 12b are provided on the side of the supporter 12 corresponding to the folded portion with the protruding part, between the concave portions 12a and 12b, passing through the hole 16 set at the flexible board 13.

In this embodiment, external electrostatic charge is transmitted via the supporter 12 and via the GND 15 to the earth. Accordingly, circuit components (not shown) electrically connected to the flexible board 13 can be protected from being destructed by electrostatic charge.

Figure 5:
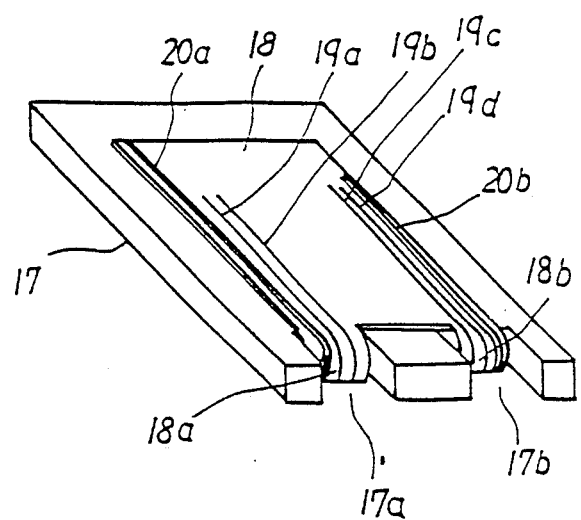
FIG. 5 is a perspective view of a structure of fitting a flexible board within an electronic apparatus according to a further embodiment of the present invention.

FIG. 5 shows a further embodiment of the present invention. GND (earth) lines 20a and 20b are continuously formed outside wiring patterns 19a and 19b or 19c and 19d along the edge of a flexible board 18 which is fitted by straddling the both sides of a supporter 17 made of iron. Electrostatic charge which comes to the supporter 17 is consequently transmitted to the GND lines 20a and 20b by secondary discharge. Concave portions 17a and 17b are formed on the supporter 17 at the bottom of which the folded portions 18a and 18b of said flexible board 18 are located.

Alternatively, the supporter 17 may be directly connected to the earth without the GND lines 20a and 20b of the flexible board 18.

In accordance with the present invention, when a flexible board is fitted by straddling both sides of a supporter, concave portions are provided at the side of said backing corresponding to the folded portion of said flexible board, and said folded portion of said flexible board having a wiring pattern is located at the bottom of said concave portions. When external electrostatic charge comes to the folded portion of said flexible board, the electrostatic charge is transmitted to the supporter by such means as spring which is provided within the apparatus. Accordingly, circuit components electrically connected to the wiring pattern of said flexible board can be easily protected from being destructed by electrostatic charge with low cost.

While only certain embodiments of the present invention have been described, it will be apparent to those skilled in the art that various changes and modifications may be made therein without departing from the spirit and scope of the present invention as claimed.

What is claimed is:

1. An electronic apparatus comprising:
    flexible circuit board means having an electric wiring pattern disposed on at least one side thereof, and having an opening formed therein; and
    supporter means for supporting said flexible circuit board means, said supporter means having first and second opposing faces and having ends disposed on the sides of said faces, wherein said supporter means includes at least a first protruding means formed on an end thereof, said first protruding means being inserted into said opening of said flexible circuit board means so that said flexible circuit board having said wiring pattern is folded over said first and second faces of said supporter means, wherein said protruding means prevents external electrostatic charge from being transmitted to said wiring pattern.

2. The electronic apparatus of claim 1, wherein a plurality of protruding means are formed on an end of said supporter means, so as to provide at least a concave portion between adjacent protruding means on an end of said supporter means.

3. The electronic apparatus of claim 1, wherein said electronic wiring pattern is provided on both sides of said flexible circuit board means.

4. The electronic apparatus of claim 3, wherein said electronic wiring pattern disposed on said flexible circuit board means, being interposed between said flexible circuit board means and said supporter means is grounded.

5. The electronic apparatus of claim 1, wherein said electronic wiring pattern on said flexible circuit board means is provided with a grounded line positioned adjacent to an edge portion of said flexible circuit board means.

6. The electronic apparatus of claim 1, wherein said electronic apparatus is an electronic calculator.

7. The electronic apparatus of claim 1, wherein said supporter means comprises metal.

8. The electronic apparatus of claim 2, wherein said supporter means comprises metal.

9. The electronic apparatus of claim 6, wherein said electronic calculator comprises:
    said electronic apparatus disposed on a lower cabinet means;
    an LSI and a display means each electrically connected to said wiring pattern of said flexible circuit board means;
    a spacer means disposed on said flexible circuit board means; and
    a film disposed on said spacer means, said film including a transparent portion which corresponds to said display means and including movable key contacts which when depressed electrically connect to corresponding portion of said wiring pattern via said spacer means, so as to perform calculator functions.

10. The electronic apparatus of claim 2, wherein said plurality of protruding means comprises first, second, and third protruding means having first and second concave portions formed therebetween, and wherein at least part of said wiring pattern runs through said concave portion.

11. The electronic apparatus of claim 9, wherein said plurality of protruding means comprises first, second, and third protruding means having first and second concave portions formed therebetween, and wherein at least part of said wiring pattern runs through said concave portions.

12. The electronic apparatus of claim 2, wherein said electronic wiring pattern disposed on said flexible circuit board means, being interposed between said flexible circuit board means and said supporter means is grounded.

13. The electronic apparatus of claim 9, wherein said electronic wiring pattern on said flexible circuit board means is provided with a grounded line positioned adjacent to an edge portion of said flexible circuit board means.

* * * * *